(12) United States Patent
Staniforth et al.

(10) Patent No.: US 7,999,228 B2
(45) Date of Patent: Aug. 16, 2011

(54) APPARATUS FOR USE IN OPERATOR TRAINING WITH, AND THE TESTING AND EVALUATION OF, INFRARED SENSORS WHICH ARE FOR MISSILE DETECTION

(75) Inventors: Michael Justin Staniforth, Southampton (GB); Graham Edward James, Southampton (GB); Stephen Holloway, Portsmouth (GB)

(73) Assignee: ESL Defence Limited, Hampshire (GB)

( * ) Notice: Subject to any disclaimer, the term of this patent is extended or adjusted under 35 U.S.C. 154(b) by 80 days.

(21) Appl. No.: 12/297,588

(22) PCT Filed: Apr. 17, 2007

(86) PCT No.: PCT/IB2007/000994
§ 371 (c)(1),
(2), (4) Date: Mar. 3, 2009

(87) PCT Pub. No.: WO2007/119163
PCT Pub. Date: Oct. 25, 2007

(65) Prior Publication Data
US 2009/0194697 A1    Aug. 6, 2009

(30) Foreign Application Priority Data
Apr. 18, 2006    (GB) .................................. 0607655.8

(51) Int. Cl.
*G01J 5/10* (2006.01)
(52) U.S. Cl. .................................................. 250/338.1
(58) Field of Classification Search ............... 250/252.1, 250/338.1, 339.06
See application file for complete search history.

(56) References Cited

U.S. PATENT DOCUMENTS

| 4,173,777 A | 11/1979 | Richmond et al. |
| 4,607,849 A * | 8/1986 | Smith et al. ............... 273/348.1 |
| 5,693,951 A | 12/1997 | Strong, III |
| 5,756,992 A * | 5/1998 | Spindler .................... 250/252.1 |
| 6,587,486 B1 * | 7/2003 | Sepp et al. ....................... 372/22 |

(Continued)

FOREIGN PATENT DOCUMENTS
DE        3238897 A1    4/1984
(Continued)

OTHER PUBLICATIONS

Search Report for UK Patent Application No. 0607655.8, dated Aug. 1, 2007.

(Continued)

*Primary Examiner* — David P Porta
*Assistant Examiner* — Marcus H Taningco
(74) *Attorney, Agent, or Firm* — Venable LLP; Jeffri A. Kiminski; Christopher Ma

(57) ABSTRACT

Apparatus (2) for use in operator training with, and the testing and evaluation of, missile detection systems which use infrared sensors which integrate incident energy over a finite time period, which apparatus (2) comprises at least one infrared illumination source (4) for illuminating the sensors, characterised in that the infrared illumination source (4) is a pseudo continuous wave laser infrared illumination source (4) with signal duty and peak power controlled by means of an amplitude, pulse width and pulse repetition interval modulation circuit (8), whereby the laser infrared illumination source (4) operates at shorter repetition intervals than the finite time period so that the laser infrared illumination source (4) appears to the infrared sensors to be a real missile signature.

19 Claims, 2 Drawing Sheets

U.S. PATENT DOCUMENTS

2003/0174315 A1    9/2003   Byren et al.
2006/0027823 A1*   2/2006   Hill et al. .................. 257/94

FOREIGN PATENT DOCUMENTS

| DE | 3238987 A1 | 4/1984 |
| GB | 2 330 449 A | 4/1999 |
| GB | 2 400 644 A | 10/2004 |
| WO | WO 95/00813 | 1/1995 |
| WO | WO-97/22230 A1 | 6/1997 |
| WO | WO-03/062773 A1 | 7/2003 |

OTHER PUBLICATIONS

Search Report issued Aug. 17, 2007 in UK application 0607655.8.
Office Action dated Jan. 5, 2010 issued in EP 07 734 313.5.
Form PCT/ISA/210 International Search Report for PCT/IB2007/000994, dated Sep. 27, 2007.
Form PCT/ISA/237 Written Opinion of the International Searching Authority for PCT/IB2007/000994, dated Sep. 27, 2007.

* cited by examiner

APPARATUS FOR USE IN OPERATOR TRAINING WITH, AND THE TESTING AND EVALUATION OF, INFRARED SENSORS WHICH ARE FOR MISSILE DETECTION

CROSS-REFERENCE TO RELATED APPLICATIONS

This application is the national phase under 35 U.S.C. §371 of PCT/IB2007/000994 filed Apr. 17, 2007, which claims priority to Great Britain Application No. 0607655.8 filed Apr. 18, 2006, the subject matter of both is incorporated herein by reference in its entirety.

BACKGROUND OF THE INVENTION

This invention relates to apparatus for use in operator training with, and the testing and evaluation of, infrared sensors for missile detection. More especially, this invention relates to apparatus for use in the testing and evaluation of infrared sensors which are for missile detection and which integrate incident energy over a finite time period.

Apparatus is known for use in operator training with, and the testing and evaluation of, infrared sensors for missile detection. The known apparatus comprises an infrared illumination source for illuminating the sensors. The infrared illumination source may be a lamp such for example as a xenon arc lamp or a quartz halogen lamp. Alternatively, the infrared illumination source may be thin filaments of carbon or a metal. The apparatus tests and evaluates the infrared missile detection sensors by illuminating them. The infrared missile detection sensors may be positioned on, for example, an aircraft.

In the above mentioned known apparatus, the use of infrared illumination sources such for example as the lamps or the thin filaments has proved to be a limiting factor in the generation of high powers in the mid-infrared wavelength range of 3-5 μm. More specifically, problems associated with the known apparatus using the lamps or the thin filaments are as follows.
1. High input power requirements for high power sources.
2. Attempts to reduce out of band wavelengths may lead to thermal management issues.
3. The generation of wavelengths which extend beyond the required infrared band can result in impractical operating conditions due to the wavelengths generated, such impractical operating conditions including those relating to eye safety and to covertness of source.
4. The beam width in any illumination system is limited by the source extent and by aperture constraints. For complete coverage of all infrared missile warning sensors, for example as placed on an aircraft, a beam width around 3° is required. However, beam widths much greater than 3° obtained with existing infrared illumination sources may result in a lower power density across the intended target.
5. Modulation capabilities of heated lamps and filaments are limited. These modulation capabilities are adequate for present day infrared missile detection sensors but they generally do not have the capacity for future developed infrared missile detection sensors.
6. High electromagnetic emissions, which are related to normal operation and the infrared illumination source being modulated, may be generated at problematic magnitudes. This is especially a problem for infrared illumination sources in the form of lamps.
7. The known infrared illumination sources cannot generate sufficient infrared power within aperture limitations which apply. These aperture limitations are dictated by the need to present a realistic source extent to the sensor, for example when mounted on an aircraft. This is especially so where imaging systems are employed.

It is an aim of the present invention to reduce the above mentioned problems.

SUMMARY OF THE INVENTION

Accordingly, in one non-limiting embodiment of the present invention there is provided apparatus for use in operator training with, and the testing and evaluation of, missile detection systems which use infrared sensors which integrate incident energy over a finite time period, which apparatus comprises at least one infrared illumination source for illuminating the sensors, characterised in that the infrared illumination source is a pseudo continuous wave laser infrared illumination source with signal duty and peak power controlled by means of an amplitude, pulse width and pulse repetition interval modulation circuit, whereby the laser infrared illumination source operates at shorter repetition intervals than the finite time period so that the laser infrared illumination source appears to the infrared sensors to be a real missile signature.

The apparatus of present invention is advantageous over known apparatus in that it uses a pseudo continuous wave laser infrared illumination source. The advantages of the pseudo continuous wave laser infrared illumination source as compared with known infrared illumination sources such as those mentioned above are as follows.
1. Infrared missile detection sensors being tested respond only to a very narrow band of wavelengths. Infrared illumination sources currently used emit energy over a very broad band of wavelengths. The use of the pseudo continuous wave laser infrared illumination source offers a much greater in-band power output within a given aperture, for a given input power, resulting in highly efficient emitter apparatus.
2. The pseudo continuous wave laser infrared illumination source has lower electrical power supply requirements than known currently used infrared illumination sources. Thus the apparatus of the present invention has low power control requirements in terms of switching, and thereby considerably less electromagnetic compatibility issues than is the case for known and currently used infrared illumination sources.
3. The pseudo continuous wave laser infrared illumination source is a narrow band illumination source which causes considerably less eye safety issues than are caused by known and currently used infrared illumination sources.
4. Pulsed lasers sources are available over a broad range of infrared wavelengths, such that the spectral characteristics of the illumination source can be tuned to specific applications efficiently. This could include use of more than one source to generate a complex spectrum. This is especially pertinent for infrared detectors which use spectral characteristics as a discriminator for determining the veracity of the illumination source.
5. The pseudo continuous wave laser infrared illumination source is able to be modulated at rates which exceed the fastest features of interest to a missile detection system.
6. The pseudo continuous wave laser infrared illumination source can approximate point sources and optical components can be designed to optimise the beam forming for a specific application, maximising boresight power for any given beam width.

In a first embodiment of the present invention, the apparatus is one in which the pseudo continuous wave laser infrared illumination source is an optical parametric oscillator which is pumped by a laser.

The pump laser may be an yttrium aluminium garnet (YAG) laser. Other types of laser may be employed. A single optical parametric oscillator is able to give sufficient power in the apparatus of the present invention.

The modulation circuit may comprise an acousto-optic modulator. The acousto-optic modulator is preferably positioned before the optical parametric oscillator. Such positioning allows the use of common, high-efficiency, low-cost modulators as opposed to the customised, low-efficiency modulators that would be required for the longer wavelengths at the optical parametric oscillator output. Preferably the optical parametric oscillator is a periodically poled lithium niobate crystal but other optical parametric oscillators may be employed.

In the first embodiment of the apparatus of the invention, the pseudo continuous wave laser infrared illumination source may include at least one mirror for separating unwanted wavelength signals, at least one mirror for creating a cavity for the optical parametric oscillator, at least one lens for focusing the laser beam into the optical parametric oscillator, and at least one beam sink for unwanted wavelengths.

Preferably, there are two of the mirrors for separating unwanted wavelengths. Preferably there are two of the mirrors for creating a cavity for the optical parametric oscillator. Preferably there are two of the beam sinks for unwanted wavelengths.

The laser may include an optical unit for shaping the beam in order to set the required beam divergence and output aperture size. The optical unit may be a faceted optical unit. Preferably, the faceted optical unit is a faceted mirror unit.

The faceted mirror unit preferably comprises a diverging lens, a reflector, and a faceted compound mirror for receiving reflected infrared energy from the reflector. The faceted mirror unit preferably also includes a window to seal the apparatus against environmental effects.

In a second embodiment of the present invention, the apparatus is one in which the pseudo continuous wave laser infrared illumination source is a quantum cascade laser.

Usually, there will be an array of the quantum cascade lasers, for ensuring that there is sufficient power for their use in the apparatus of the invention. In addition, because of the slight variation in the spectral response between individual quantum cascade lasers, an array of lasers will ensure a greater spectral diversity should that be required for a particular application.

In the second embodiment of the invention, the apparatus may include collimating means for collimating the laser beam.

The apparatus may be one in which the array of quantum cascade lasers is an array of quantum cascade laser chips, and in which the collimating means comprises at least one collimating lens for each one of the quantum cascade laser chips. The collimating means may also comprise at least one faceted optical unit for increasing size of the output aperture.

BRIEF DESCRIPTION OF THE INVENTION

Embodiments of the invention will now be described solely by way of example and with reference to the accompanying drawings in which.

DETAILED DESCRIPTION OF EXEMPLARY EMBODIMENTS OF THE PRESENT INVENTION

Figure 1:
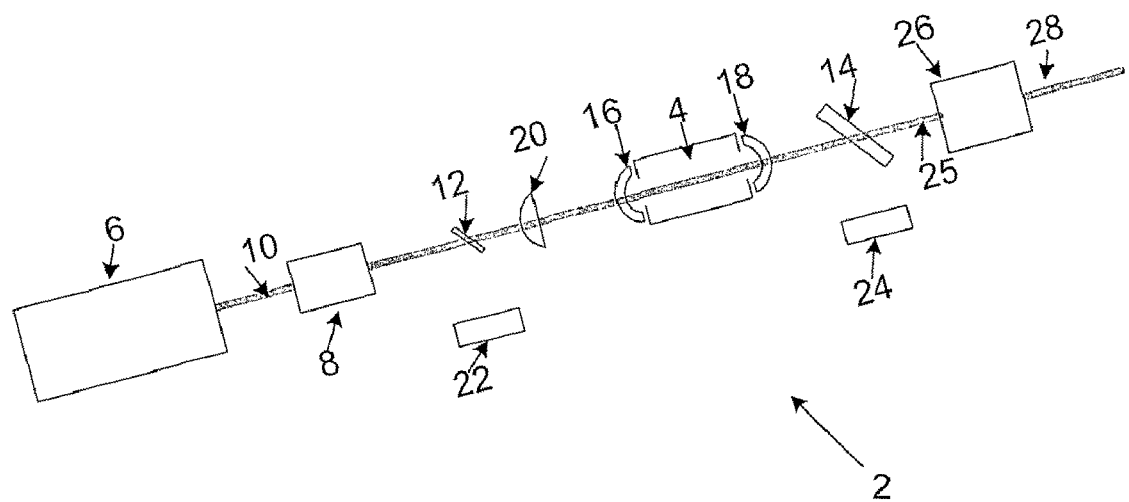
FIG. 1 shows first apparatus for use in operator training with and the testing and evaluation of infrared missile detection sensors.
Figure 2:
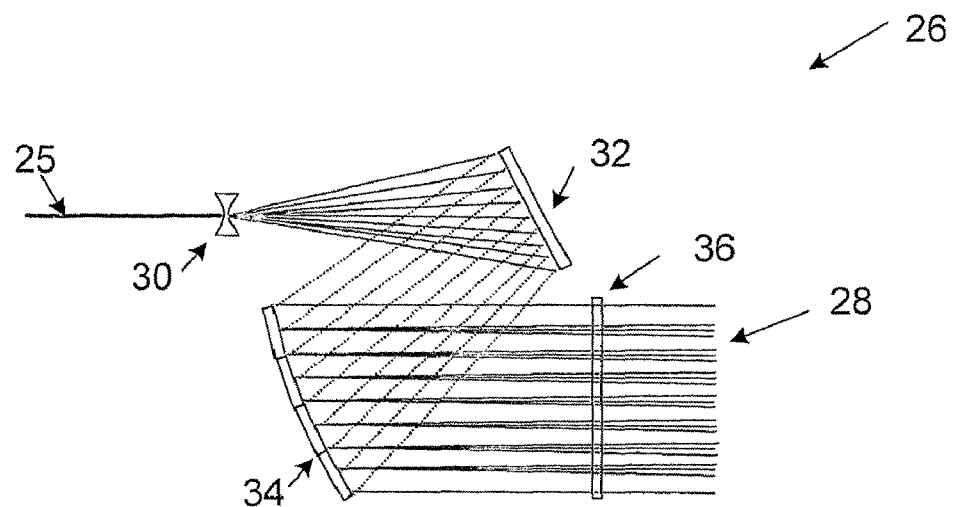
FIG. 2 shows in more detail part of the apparatus shown in FIG. 1.

Referring to FIGS. 1 and 2, there is shown apparatus 2 for use in the testing and evaluation of infrared sensors which are for missile detection and which integrate incident energy over a finite time period, according to an exemplary embodiment of the invention. The apparatus 2 comprises at least one infrared illumination source for illuminating the sensors. The infrared illumination source is in the form of a pseudo continuous wave laser infrared illumination source with signal duty and peak power controlled by means of an amplitude, pulse width and pulse repetition interval modulation circuit, whereby the infrared illumination source operates at shorter repetition intervals than the finite time period so that the laser infrared illumination source appears to the infrared sensors to be a missile signature. The laser infrared illumination source is an optical parametric oscillator 4, which is pumped by a laser 6. The laser 6 is a yttrium aluminium garnet (YAG) laser.

The modulation circuit comprises an acousto-optic modulator 8 for modulating and controlling a laser beam 10 in order to create a precise temporal output profile for the laser beam 10. As shown in FIG. 1, the acousto-optic modulator 8 is placed before the optical parametric oscillator 4. The optical parametric oscillator 4 is in the form of a periodically poled lithium niobate crystal. Positioning of the acousto-optic modulator 8 before the optical parametric oscillator 4 is innovative and advantageous, it being a more common practice to place an acousto-optic modulator after an optical parametric oscillator. By placing the acousto-optic modulator 8 before the optical parametric oscillator 4, the following benefit is obtained: The wavelength that the acousto-optic modulator 8 needs to modulate before the optical parametric oscillator 4 is shorter than the preferred wavelength after the acousto-optic modulator 8. This means that the optical specification for the acousto-optic modulator 8 is lower when placed before the optical parametric oscillator 4. For example, the cost of a 1 um region off-the-shelf acousto-optic modulator is significantly less than an equivalent mid-infrared acousto-optic modulator.

The laser head contains a laser source, a power supply and other necessary laser component parts.

The apparatus 2 includes two mirrors 12, 14 for separating unwanted wavelength signals, and two mirrors 16, 18 forming a meniscus to create a cavity for the optical parametric oscillator 4. A lens 20 focuses the laser beam 10 into the optical parametric oscillator 4. Beam sinks 22, 24 are provided for unwanted wavelengths. A faceted optical unit 26 is provided for shaping the beam 25 into beam 28 in order to set the required divergence and aperture size.

As shown in FIG. 2, the faceted optical unit 26 is a faceted mirror unit which comprises an optional diverging lens 30, an optional reflector 32, a faceted compound mirror 34 and an exit window 36. The faceted compound mirror 34 is for receiving reflected infrared energy from the reflector 32 as shown. For simplicity of illustration, the faceted compound mirror 34 has been shown with only four facets. The actual number of facets will depend upon the required final beam width for the shaped beam 28 and the required effective aperture size and fidelity. The exit window 36 receives infrared energy from the faceted compound mirror 34 as shown.

In operation of the faceted optical unit 26 shown in FIG. 2, the faceted compound mirror 34 distorts the optical path of each reflected portion of the infrared beam as reflected from the reflector 32. The resulting image appears as a number of separate sources, one for each facet. There may be, for example forty facets. The composite source, which appears as a combination of each source, is spread across the entire aperture. For use with an infrared sensor on an aircraft, as the sensor cannot spatially resolve these points at range, they appear as a realistic larger source extent. This source manipulation is essential if the infrared sensor is not to dismiss the infrared illumination source as a false alarm. A secondary purpose of the faceted compound mirror 34 is to ensure that the output beam has a sufficient width and height to illuminate as necessary, for example to illuminate an entire aircraft. By its inherent nature, the laser beam 25 is narrow and would only illuminate a portion of a required object such for example as an aircraft if it were optically unaltered.

Figure 3:
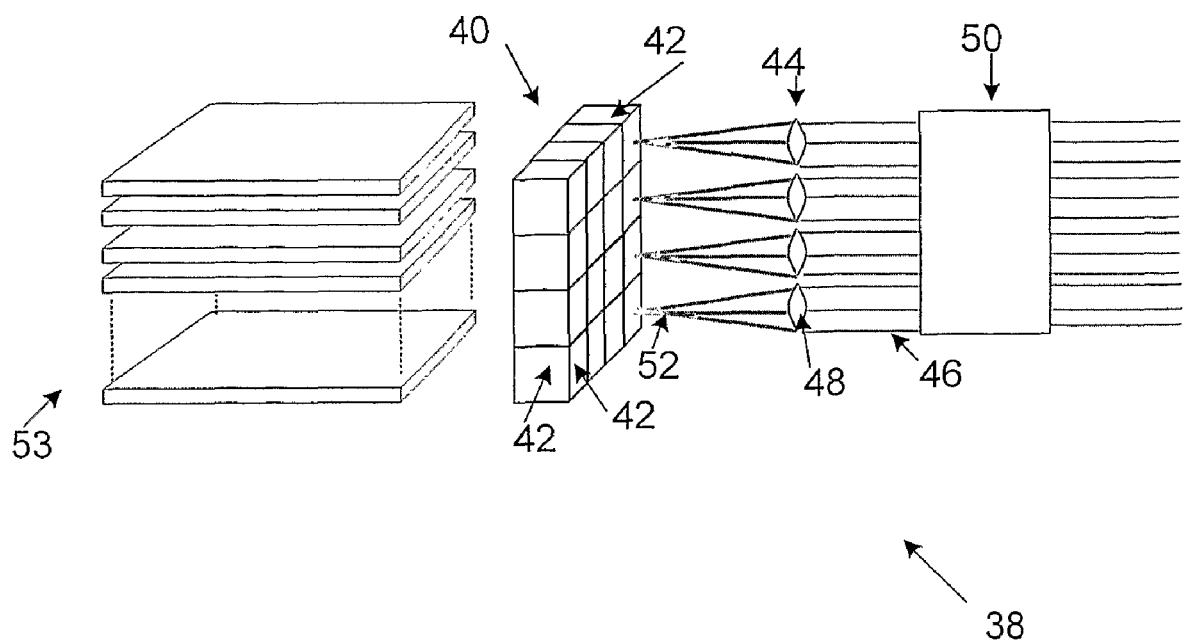
FIG. 3 shows part of second apparatus for use in operator training with and the testing and evaluation of infrared missile detection sensors.

Referring now to FIG. 3, there is shown part of apparatus 38 in which the laser infrared illumination source comprises an array 40 of quantum cascade lasers 42. The array 40 of quantum cascade lasers 42 is such that the quantum cascade lasers 42 are in the form of quantum cascade laser chips. The apparatus 38 includes collimating means 44 for collimating the laser beam 52 into the laser beam 46. The collimating means 44 comprises a separate collimating lens 48 for each one of the quantum cascade laser chips. As shown in FIG. 3, the apparatus 38 also comprises an optical beam shape control unit 50.

The number of the quantum cascade lasers 42 employed in the array 40 is dictated by the power required from the apparatus 38. Low power applications may require as few as one laser. In low power applications the laser beam 52 aperture may be increased and the beam shaped using one or more faceted optical units such as described in FIG. 2. In such cases the diverging lens 30 may not be required as quantum cascade lasers 42 typically have diverging output beams 52. High power applications require multiple quantum cascade lasers and as such have a suitable optical aperture by nature of the spatial extent of the array 40. FIG. 3 represents a high power application. The beam 52 exiting each quantum cascade laser chip 42 requires collimation with an appropriate collimating lens 48. Each quantum cascade laser channel provides a single optical aperture. At long range, for example more than 500 meters, sensors, for example on an aircraft, cannot resolve the detail, and the array 40 appears as a single extended source. The individual collimated beams 46 are able to be expanded or formed with further optics 50 in order to meet beam divergence and aperture requirements.

In the apparatus 38, modulation is achieved by means of modulation drive circuits 53. Each quantum cascade laser 42 has a modulation drive circuit 53 that controls pulse width, pulse repetition interval and pulse amplitude. The quantum cascade lasers 42 are capable of very high pulse repetition frequencies. Such operating frequencies are much faster than the time constant of infrared sensors for missile detection, creating a pseudo-continuous wave beam that the sensors determine to be a realistic threat. The use of the three modulation parameters in combination maximizes the dynamic range of the system. Further, the use of duty modulation to control output power provides a near-linear and repeatable control function so that the apparatus 38 produces a more accurate and reproducible source than is achievable with known apparatus comprising an infrared illumination source for illuminating the sensors. The relatively low individual power from the quantum cascade lasers 42 means that the array 40 is required for demanding applications, and the array 40 may be in the order of tens of the quantum cascade lasers 42. The use of the array 40 means that pulses from individual channels can be interleaved, thereby reducing the pulse repetition frequency requirements of each channel by a factor proportional to the number of quantum cascade lasers 42 in the array 40. Consequently, an increase in array size may provide further improvements to the overall system dynamic range.

Atmospheric effects can influence the quality and performance of a laser based system through the process of scintillation. The risk of these effects is addressed by the apparatus 38 shown in FIG. 3 by the following.

1. A number of spatially distributed sources, which increase the effective source extent.
2. Individual aperture/lens size is maximised for each channel.
3. Pulse interleaving ensures that there is no interference between channels.
4. The broad band, multimode nature of each quantum cascade laser channel, coupled with a short pulse duration, reduces the coherence length from that of a conventional laser.

It is to be appreciated that the embodiments of the invention described above with reference to the accompanying drawings have been given by way of example only and that modifications may be effected.

What is claimed is:

1. Apparatus for use in operator training with, and the testing and evaluation of, missile detection systems which use infrared sensors which integrate incident energy over a finite time period, which apparatus comprises:
    at least one infrared illumination source for illuminating the sensors, wherein the at least one infrared illumination source comprises a pseudo continuous pulsed wave laser infrared illumination source with signal duty and peak power controlled by means of an amplitude, pulse width and pulse repetition interval modulation circuit, wherein the laser infrared illumination source operates at shorter repetition intervals than the finite time period and the amplitude, pulse width and pulse repetition interval modulation circuit modulates the signal duty and the peak power of the laser infrared illumination source so that the laser infrared illumination source appears to the infrared sensors to be a real missile signature.

2. Apparatus according to claim 1 in which the pseudo continuous pulsed wave laser infrared illumination source comprises an optical parametric oscillator which is pumped by a laser.

3. Apparatus according to claim 2 in which the laser comprises a yttrium aluminum garnet (YAG) laser.

4. Apparatus according to claim 2 in which the amplitude, pulse width and pulse repetition interval modulation circuit comprises an acousto-optic modulator.

5. Apparatus according to claim 4 in which the acousto-optic modulator is positioned before the optical parametric oscillator.

6. Apparatus according to claim 4 in which the optical parametric oscillator comprises a periodically poled lithium niobate crystal.

7. Apparatus according to claim 4 in which the pseudo continuous pulsed wave laser infrared illumination source includes at least one mirror for separating unwanted wavelength signals, at least one mirror for creating a cavity for the optical parametric oscillator, at least one lens for focusing the laser beam into the optical parametric oscillator, and at least one beam sink for unwanted wavelengths.

8. Apparatus according to claim 7 in which there are two of the mirrors for separating unwanted beam wavelengths.

9. Apparatus according to claim 7 in which there are two of the mirrors for creating a cavity for the optical parametric oscillator.

10. Apparatus according claim 7 in which there are two of the beam sinks for unwanted wavelengths.

11. Apparatus according to claim 4 in which the laser includes at least one optical unit for expanding the beam in order to increase the size of the output aperture.

12. Apparatus according to claim 11 in which the at least one optical unit comprises a faceted optical unit.

13. Apparatus according to claim 12 in which the faceted optical unit comprises a faceted mirror unit.

14. Apparatus according to claim 13 in which the faceted mirror unit comprises at least one diverging lens, at least one reflector, and at least one faceted compound mirror for receiving reflected infrared energy from the reflector.

15. Apparatus according to claim 14 and including a window to seal the apparatus against environmental effects.

16. Apparatus according to claim 1 in which the pseudo continuous pulsed wave laser infrared illumination source comprises a quantum cascade laser.

17. Apparatus according to claim 16 in which there is an array of the quantum cascade lasers.

18. Apparatus according to claim 17 in which the array of the quantum cascade lasers comprises an array of quantum cascade laser chips, and in which the collimating means comprises at least one collimating lens for each one of the quantum cascade laser chips.

19. Apparatus according to claim 16 including collimating means for collimating the laser beam.

* * * * *